(12) United States Patent
MacDonald et al.

(10) Patent No.: US 7,378,993 B1
(45) Date of Patent: May 27, 2008

(54) METHOD AND SYSTEM FOR TRANSMITTING DATA

(75) Inventors: Colin MacDonald, Austin, TX (US);
Alan J. Carlin, Austin, TX (US);
Donald L. Tietjen, Lakeway, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/619,932

(22) Filed: Jan. 4, 2007

(51) Int. Cl.
*H03M 5/00* (2006.01)
(52) U.S. Cl. .......................................... 341/55; 341/50
(58) Field of Classification Search ................. 341/50, 341/55
See application file for complete search history.

(56) References Cited

U.S. PATENT DOCUMENTS

| | | | | |
|---|---|---|---|---|
| 6,167,560 | A * | 12/2000 | Jenkins et al. ................. | 716/17 |
| 7,218,152 | B2 * | 5/2007 | Murakami et al. .......... | 326/113 |
| 2006/0007026 | A1 * | 1/2006 | Jung et al. .................... | 341/50 |

OTHER PUBLICATIONS

Musoll, E. et al., Working-zone encoding for reducing the energy in microprocessor address buses☐☐IEEE Transactions on Very Large Scale Integration (VLSI) Systems, Publication Date: Dec. 1998 vol. 6 , Issue: 4 pp. 568-572.*
Benini, L. et al., Address bus encoding techniques for system-level power optimization;☐☐Proceedings Design, Automation and Test in Europe, 1998., Feb. 23-26, 1998 pp. 861-866 ISBN: 0-8186-8359-7 INSPEC Accession No. 590689.*

* cited by examiner

*Primary Examiner*—Howard Williams
(74) *Attorney, Agent, or Firm*—Craig J. Yudell; Dillon & Yudell LLP

(57) ABSTRACT

A method and system for transmitting binary-coded data use partitioning of data words in a plurality of data nibbles. The data nibbles are coded using modified a 1-bit hot coding format that transforms a data nibble in a data segment including a plurality of bit groups. A change in a digital state at a bit position in a more significant bit group is maintained at that bit position in less significant bit groups, and information is transmitted in a form of a transition between digital states. The data segments are transmitted in phases each including one bit group from each data segment. At a receiving terminal, the bit groups are converted back in the binary-coded data words. In one application, the invention is used to reduce power consumption during data transmissions to and from an integrated circuit device.

24 Claims, 7 Drawing Sheets

| DECIMAL FORMAT | BCD FORMAT | 1-BIT HOT CODING FORMAT | MHC NIBBLE 1 | MHC NIBBLE 2 | MHC NIBBLE 3 | MHC NIBBLE 4 |
|---|---|---|---|---|---|---|
| 0 | 0000 | 0000 0000 0000 0000 | 0000 | 0000 | 0000 | 0000 |
| 1 | 0001 | 0000 0000 0000 0001 | 0000 | 0000 | 0000 | 000C |
| 2 | 0010 | 0000 0000 0000 0010 | 0000 | 0000 | 0000 | 00C0 |
| 3 | 0011 | 0000 0000 0000 0100 | 0000 | 0000 | 0000 | 0C00 |
| 4 | 0100 | 0000 0000 0000 1000 | 0000 | 0000 | 0000 | C000 |
| 5 | 0101 | 0000 0000 0001 0000 | 0000 | 0000 | 000C | 000M |
| 6 | 0110 | 0000 0000 0010 0000 | 0000 | 0000 | 00C0 | 00M0 |
| 7 | 0111 | 0000 0000 0100 0000 | 0000 | 0000 | 0C00 | 0M00 |
| 8 | 1000 | 0000 0000 1000 0000 | 0000 | 0000 | C000 | M000 |
| 9 | 1001 | 0000 0001 0000 0000 | 0000 | 000C | 000M | 000M |
| 10 | 1010 | 0000 0010 0000 0000 | 0000 | 00C0 | 00M0 | 00M0 |
| 11 | 1011 | 0000 0100 0000 0000 | 0000 | 0C00 | 0M00 | 0M00 |
| 12 | 1100 | 0000 1000 0000 0000 | 0000 | C000 | M000 | M000 |
| 13 | 1101 | 0001 0000 0000 0000 | 000C | 0000 | 000M | 000M |
| 14 | 1110 | 0010 0000 0000 0000 | 00C0 | 0000 | 00M0 | 00M0 |
| 15 | 1111 | 0100 0000 0000 0000 | 0C00 | 0000 | 0M00 | 0M00 |

METHOD AND SYSTEM FOR TRANSMITTING DATA

BACKGROUND OF THE INVENTION

1. Field of the Invention

The present inventions generally relates to methods and systems for transmitting binary-coded data to and from integrated circuit (IC) devices.

2. Description of the Related Art

The present invention generally relates to methods and systems for transmitting binary-coded data to and from IC devices and, in particular, between portions of system-on-chip (SoC) devices or between the IC devices and respective peripheral devices.

In the IC devices, the power consumed by system buses, such as data, address, and command buses, may represent a significant portion of the total power used by an IC device. In general, power consumption of a system bus is proportional to an average number of transitions occurring on bit lanes of the bus during transmission of the data. For example, in SoC devices using high-end microprocessors and having 32/64-bit system buses, input/output (I/O) systems may consume up to 70% of the total power.

Recent designs in the field of the low power I/O systems have been mostly focused on increasing transmission capacity of the system busses using a priori knowledge of the data to be transmitted (i.e., during transmission of non-random or partially random data) or on implementation of alternative data coding schemes. However, such approaches often require hardware customization of the respective system buses (for example, increasing the widths of a data or address bus) and may limit compatibility between the ICs and peripheral devices.

As such, despite the considerable effort in the art devoted to development of low power systems for transmitting data, further improvements would be desirable.

BRIEF DESCRIPTION OF THE DRAWINGS

In the following detailed description of exemplary embodiments of the invention, reference is made to the accompanied drawings, which form a part hereof, and in which are shown by a way of illustration specific exemplary embodiments in which the invention may be practiced, as follows:

FIG. 3 is a table illustrating a coding format used in the method of FIG. 1;

Figure 1:
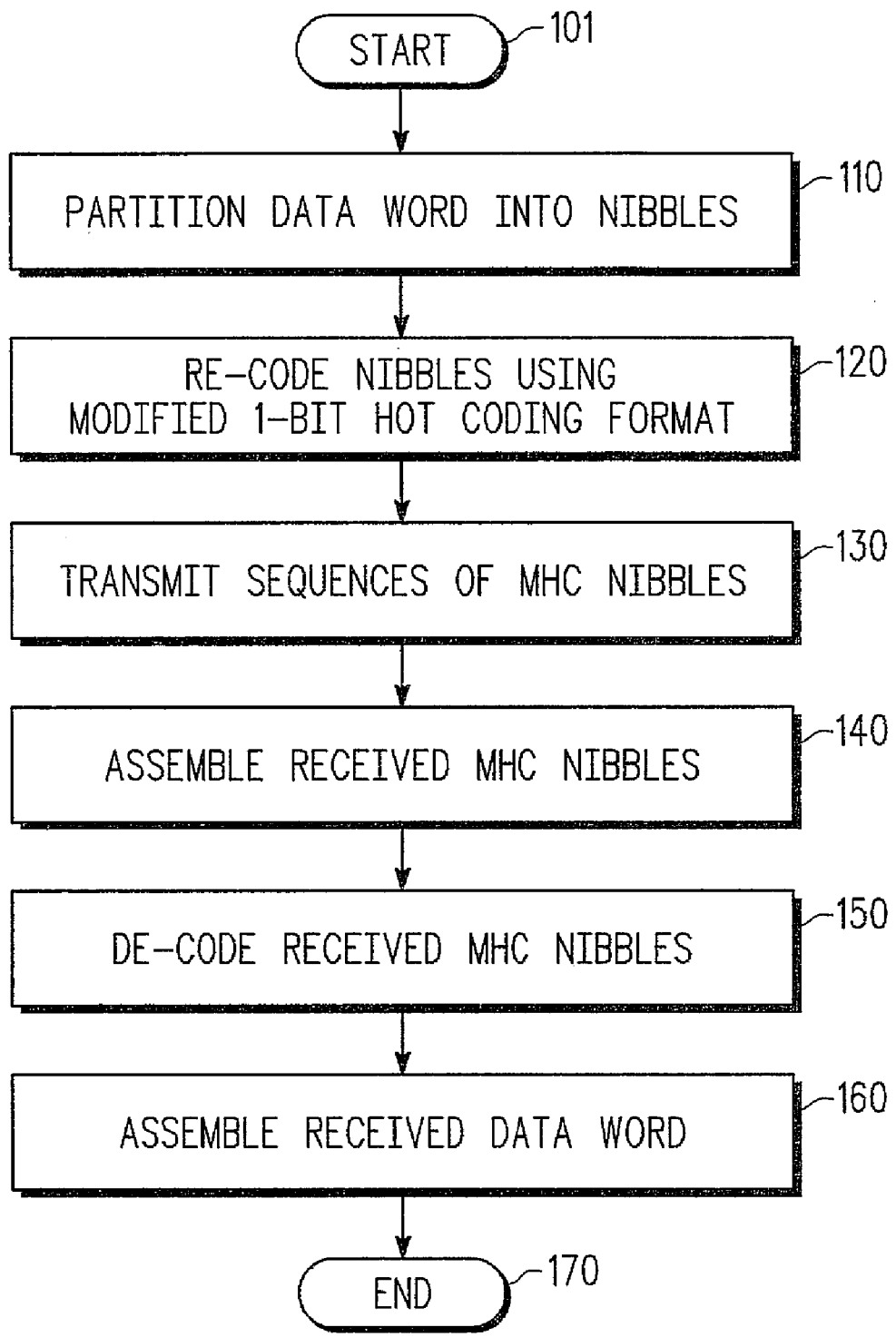
FIG. 1 is a flow diagram illustrating a method for transmitting binary-coded data in accordance with one embodiment of the present invention.

To facilitate understanding, identical reference numerals have been used, where possible, to designate identical elements that are common to the figures, except that suffixes may be added, when appropriate, to differentiate such elements. The images in the drawings are simplified for illustrative purposes and are not depicted to scale. It is contemplated that features or steps of one embodiment may be beneficially incorporated in other embodiments without further recitation.

The appended drawings illustrate exemplary embodiments of the invention and, as such, should not be considered as limiting the scope of the invention that may admit to other equally effective embodiments.

DETAILED DESCRIPTION OF PREFERRED EMBODIMENTS

Figure 2:
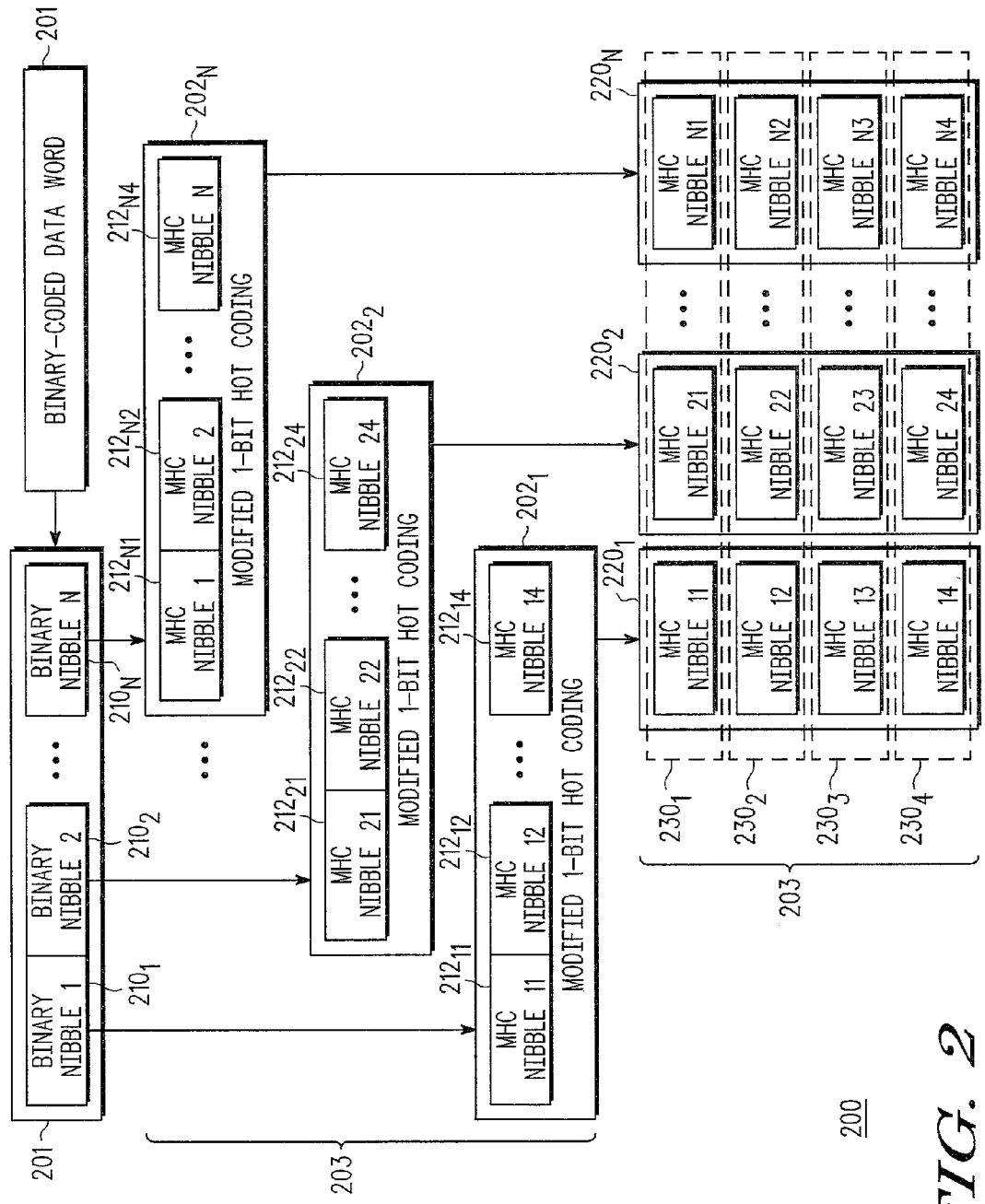
FIG. 2 is schematic diagram illustrating a data formatting scheme used in the method of FIG. 1.

Referring to the figures, FIG. 1 depicts a flow diagram illustrating a method 100 for transmitting binary-coded data in accordance with one embodiment of the present invention. In exemplary applications, the method 100 is used to reduce power consumption during data exchanges between or within an IC device, such as SoC devices, or between the IC and peripheral devices. FIG. 2 shows a schematic diagram 200 illustrating a data formatting scheme used in the method 100. FIG. 3 depicts a table 300 illustrating a coding format of the method 100. In various embodiments, method steps of the method 100 are performed in the depicted order or at least two of these steps or portions thereof may be performed contemporaneously or in a different order.

The method 100 starts at step 101 and proceeds to step 110. At step 110, data words of random binary-coded data to be transmitted are partitioned. Such binary-coded data may represent information, an address of the information, a command, or a combination thereof. Prior to the transmission, the data words may be coded using any binary-coded data format, for example, a binary-coded decimal (BCD) format, a binary-coded hexadecimal (BCH) format, or a binary-coded octal (BCO) format.

Referring to FIG. 2, a binary-coded data word 201 having a bit length L is partitioned in N binary nibbles 210 each having a bit length (i.e., number of bits) K, wherein K=L/N and L, N, and K are integers. Each binary nibble 210 includes a plurality of consecutive (or adjacent) bits of the binary-coded data word 201. In one particular example, when L=16, N=4, and K=4, the 16-bit data word 201 is portioned in 4 binary nibbles 2101-2104 each having 4 bits, wherein the binary nibbles 2101, 2102, 2103, and 2104 include bits 0-3, 4-7, 8-11, and 12-15 of the 16-bit data word 201, respectively.

Referring back to FIG. 1, at step 120, nibbles 210 are coded, or formatted, using a modified 1-bit hot coding (MHC) format. The MHC format transforms each binary nibble 210 in a MHC data segment 202 having a plurality of bit groups, each bit group having a pre-determined bit length. Herein, such bit groups are referred to as MHC nibbles 212. Together, the MHC data segments 202 form a MHC data word 203 corresponding to the binary-coded data word 201.

The MHC nibbles 212 are coded in a manner providing that a change in a digital state at a bit position in a more significant MHC nibble is preserved, at that bit position, in less significant MHC nibbles of the MUC data segment 202. The terms "coding" and "formatting", with or without the prefix "re-", are used herein interchangeably.

In one particular example, each 4-bit binary nibble 210 is transformed in a 16-bit digital data segment 202 having four 4-bit MHC nibbles 212P1-212P4, where P is an integer and $1 \leq P \leq N$. Herein, in the suffix of a MHC nibble, the first character identifies a corresponding binary nibble 210 and the second character identifies a position of the MHC nibble within the MHC data segment 202. Arbitrarily, herein a MHC nibble, which second character has a smaller numerical value, contains more significant bits of the re-formatted data segment 202.

Referring to FIG. 3, a table 300 illustrates the modified MHC coding format used in the method 100. Decimal and BCD representations of the binary nibbles 210 are shown in columns 310 and 320. Using the 1-bit hot formatting scheme, 16-bit data words corresponding to the binary nibbles 210 as re-coded, as shown in a column 330 (for clarity, adjacent 4-bit groups are separated with a space).

Results of applying the MHC coding format to the 16-bit data words of the column 330 are shown in a column 340 and sub-columns 341-344. More specifically, the column 340 contains the MHC data segments 202, and the sub-columns 341-344 contain the MHC nibbles 212 of the respective MHC data words. In particular, each 4-bit group of a respective 16-bit data word in the column 330 is re-formatted in a manner providing that a change in a digital state at a bit position in a more significant bit group is preserved at that bit position in less significant bit group(s) of a MHC data segment 202 (sub-columns 341-344).

For example, a decimal value 10 (column 310) is represented by a BCD data word (1010) in the column 320 and by a 1-bit hot coded data word (0000 0010 0000 0000) in the column 330. This data word has, starting with a most significant bit group, four 4-bit groups (0000), (0010), (0000), and (0000). After applying the MHC coding format, the 1-bit hot coded data word is re-coded in the MHC data segment 202 (column 340) having four MHC nibbles 212 (sub-columns 341-344).

In this example, a first change (denoted in the table 300 as "C") in a digital state of a bit in the MHC nibble versus the digital state at that bit position in a preceding MHC nibble appears in the second most significant MHC nibble (nibble 2, sub-column 342). In the MHC format, in contrast with the 1-bit hot coding scheme, this change in the digital state is maintained (denoted in the table 300 as "M") in all least significant MHC nibbles of the MHC data word (i.e., in nibbles 3 and 4 of the sub-columns 343 and 344, respectively). As such, the MHC format transforms the BCD data word (1010) in a MHC data word (0000 0010 0010 0010). Herein, a content of the most significant MHC nibble (i.e., nibble 1, sub-column 341) corresponds to the content of a respective bit group of the data word in column 330.

During transmission of a sequence of the MHC data words 203, a content of the most significant MHC nibble 212 (e.g., MHC nibble 212P1) in the MHC data word to be transmitted is compared, bit per bit, to the content of the least significant MHC nibble (e.g., MHC nibble 212P4) of the preceding MHC data word (i.e., the MHC data word that has been transmitted). Then, to reduce even further a number of transitions on bit lanes of a transmission bus of the IC device, the discussed above MHC coding format is used to code the most significant MHC nibble to be transmitted relative to the least significant MHC nibble of the preceding MHC data words 203 (discussed in detail below in reference to FIG. 4).

Referring back to FIG. 1, at step 130, the MHC data words 203 are transmitted via a system bus (e.g., bi-directional data bus) coupling transmitting and receiving terminals of the respective IC devices (discussed in detail below in reference to FIG. 5). Prior to the transmission, the MHC data words 203 are re-grouped in series sequences 220 of the MHC nibbles 212, and each sequence 220 is transmitted using a pre-defined group of bit lanes of the system bus. Together, the MHC nibbles 212P1-212P4 in each phase 230 utilize the full width (i.e., all bit lanes) of the bus.

Referring back to FIG. 2, each MHC data word 203 is transmitted in a plurality of consecutive phases 230 (for example, 4 phases 2301-2304), wherein each such a phase includes one MHC nibble 212 from each MHC data segment 202. In a further embodiment, information at a bit position in the MHC nibbles 212 is transmitted in a form of a transition between digital states (versus transmission of the respective digital states).

In operation, the method 100 provides a reduction in the number of transitions between digital states on the bit lanes of a respective transmission bus (for example, data bus) and, as such reduces power consumption in the communicating IC devices. Referring to a Table 1 below, using the MHC format, transmission of a BCD data word 0x5A followed by a BCD data word 0xA5 via an 8-bit bus requires only 4 transitions between the digital states of the respective bit lanes of the bus.

TABLE 1

| | | Transmitted MHC Data Word | |
|---|---|---|---|
| BCD Data Word | Phase Number | MHC Nibble 1 | MHC Nibble 2 |
| 5A | 1 | 0000 | 0000 |
| | 2 | 0000 | 0010 |
| | 3 | 0001 | 0010 |
| | 4 | 0001 | 0010 |
| A5 | 5 | 0001 | 0010 |
| | 6 | 0011 | 0010 |
| | 7 | 0011 | 0011 |
| | 8 | 0011 | 0011 |

Figure 4:
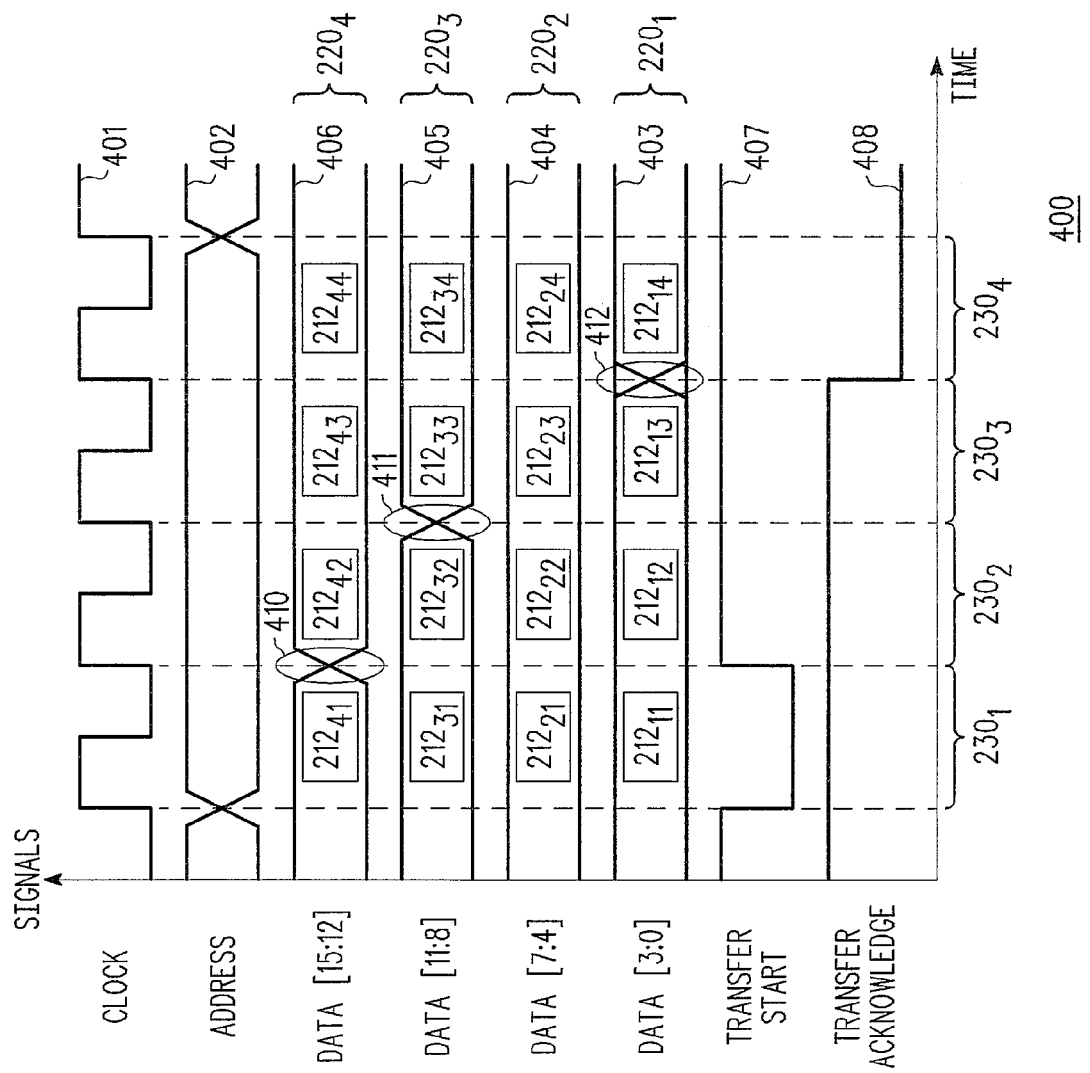
FIG. 4 depicts a series of illustrative timing diagrams of signals, which might appear on transmission lines of a device using the method of FIG. 1.

FIG. 4 depicts a series 400 of illustrative timing diagrams of signals, which might appear on corresponding transmission lines of an IC device transmitting or receiving data using the method 100. In the depicted illustrative example, a 16-bit MHC data word 220 is transmitted via a 16-bit data bus. Start and end of the transmission are indicated by transitions to logic low of signals "Transfer Start" and "Transfer Acknowledge", respectively (graphs 407, 408).

The MHC data word 203 is transmitted during four consecutive phases 2301-2304. Illustratively, these phases are synchronized with rising edges of a clock signal 401 (graph 401), and each phase includes the MHC nibbles 212 of the same seniority. For example, the phase $230_1$ includes the MHC nibbles $212_{11}$, $212_{21}$, $212_{31}$, and $212_{41}$. In the depicted embodiment, address data is provided during all phases 230 (graph 402). Each sequence 220 of the respective MHC nibbles 212 is transmitted using a pre-assigned group of bit lanes. In particular, the sequences $220_1$-$220_4$ are transmitted using bit lane groups [3-0], [7-4], [11-8], and [15-12], respectively (graphs 403-406).

Illustratively, in graphs 403, 404, and 406, changes at bit positions in the MHC nibbles $212_{P1}$-$212_{P4}$ of the respective sequences 220 are shown as events 410-412. In a string of the MHC nibbles, such events occur only when digital states change at bit positions in the MHC nibble being transmitted versus the preceding MHC nibble. As such, on some bit lanes, there may be no transitions between the corresponding sequences (i.e., phases) or MHC data words. Illustratively, in the depicted example, there are no transitions between the preceding and currently transmitted MHC data words on the bit lane group [7:4] and only single transitions between the phases on the bit lane groups [3-0], [11-8], and [15-12]. A numerical value of the reduction in an average number of the transitions achieved using the MHC formatting scheme of the method 100 is discussed in detail below in reference to FIGS. 6-7.

In alternate embodiments (not shown), using a sufficiently wide data bus, the MHC nibbles of at least a portion of the phases 230 may be transmitted in parallel, i.e., several phases 230 may be synchronized with the same rising edge of the clock signal 401. For example, the MHC nibbles 2121 and 2122 of an 8-bit BCD data word 201 having two 16-bit binary nibbles 2101 and 2102 may be transmitted in parallel using a 32-bit data bus.

Referring back to FIG. 1, at step 140, at a destination terminal, the sequentially received MHC nibbles 212P1-212P4 are selectively assembled to form the respective MHC data segments 2021-202N.

At step 150, the MHC data segments 2021-202N are de-coded (or converted) from the MHC format to form the binary nibbles 2101-210N (e.g., BCD nibbles 2101-210N).

At step 160, the binary nibbles 2101-210N are assembled to form the binary-coded data words 201 (e.g., BCD data words 201).

Upon completion of step 160, at step 170, the method 100 ends.

Figure 5:
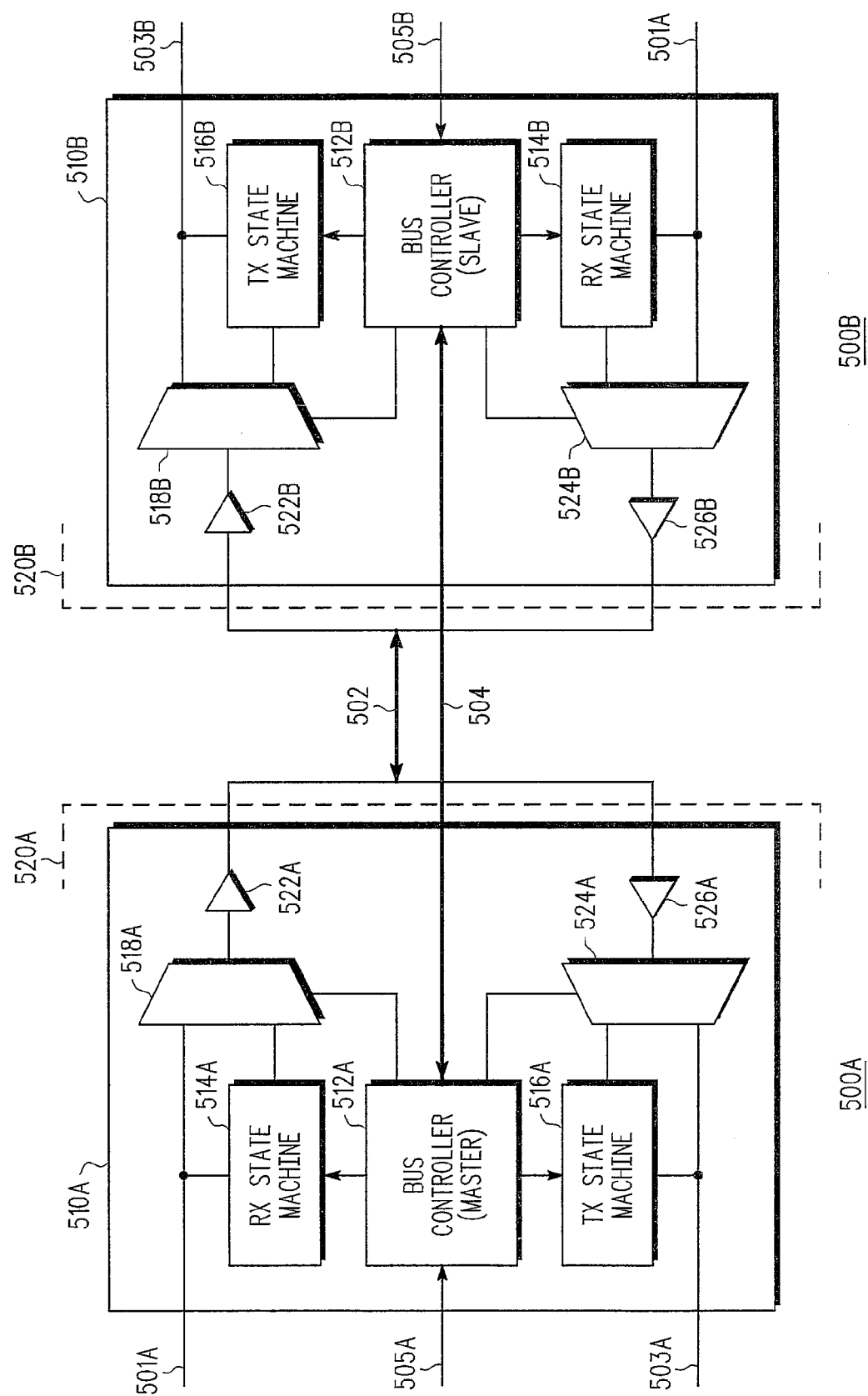
FIG. 5 depicts communicating units of integrated circuits exchanging data using the method of FIG. 1.

FIG. 5 depicts communicating units 510A and 510B of ICs 500A and 500B, which exchange data using the method 100 of FIG. 1. Illustratively, the units 510A and 510B are portions of transmitting/receiving terminals 520 coupled using an address/command bus 504 and respective bit lanes of a bi-directional data bus 502. Each unit 510 includes a facilitating bi-directional transmission of one MHC nibble 212 (e.g., binary nibble 212P1) of the MHC data segments 202 and utilizes K bit lanes (e.g., four bit lanes) of the bus 502.

Generally, the unit 510 includes transmitting (TX) and receiving (RX) state machines 514 and 516, a bus controller 512 supervising these state machines, gates 522 and 526, and optional switches 518 and 524. Data exchanges between the units 510 are administered via a command link 505 (arbitrarily, the bus controller 512A as shown as a master bus controller). A binary-coded data stream to be transmitted (e.g., data stream coded using the BCD format) is provided to the TX state machine 514 and a received data stream is provided from the RX state machine 516 using interfaces 501 and 503, respectively.

The TX state machine 514 is adapted to perform partitioning of the incoming binary-coded data words 201 in the binary nibbles 210, re-format the binary nibbles 210 in the MHC data segments 202, and generate and transmit, in phases 230, the sequences 220 of the MHC nibbles 212, as discussed above in reference to steps 110, 120, and 130 in FIG. 1 and FIGS. 2-4. Accordingly, the RX machine 516 is adapted to assemble the received MHC nibbles 212 to form the MHC data segments 202, re-format the MHC data segments 202 in the binary nibbles 210, and assemble the binary-coded data words 201, as discussed above in reference to steps 140, 150, and 160 and FIGS. 1-3.

The switches 518 and 524 allow for the incoming conventionally coded data steams (e.g., data streams coded using the BCD format) to bypass the TX and RX state machines 514 and 516. In operation, the switches 518 and 524 provide backward compatibility with the transmitting/receiving terminals of the ICs adapted for exchanging information coded using data formats of the prior art.

Figure 6:
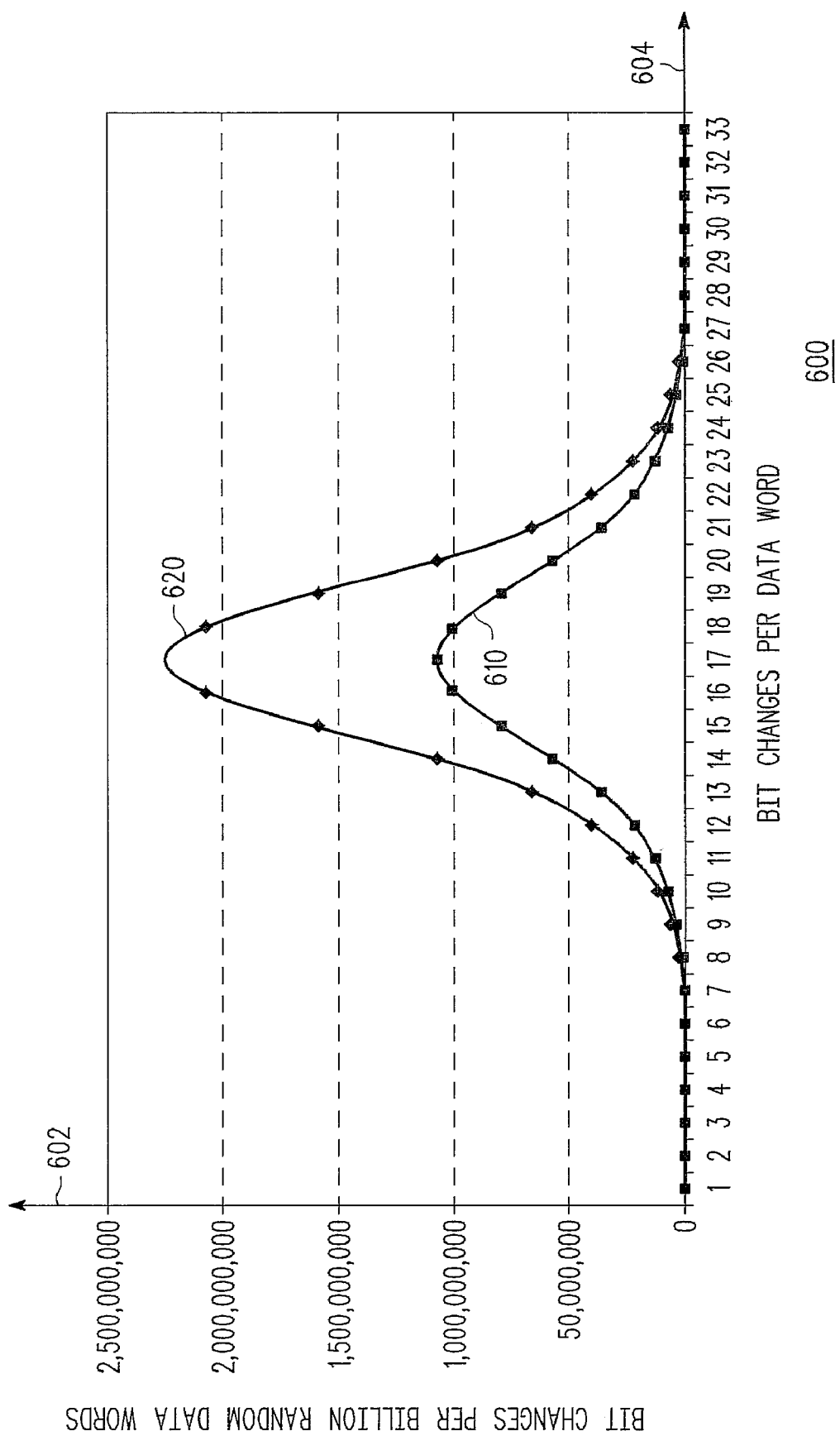
FIG. 6 depicts a series of exemplary graphs illustrating effectiveness of the coding format of the method of FIG. 1.

FIG. 6 depicts a series 600 of exemplary graphs illustrating effectiveness of the MHC coding format of the method 100 of FIG. 1. In particular, graphs 610 and 620 show a number of bit changes in random 32-bit data words (y-axis 602) as a function of a number of bit changes in a data word (x-axis 604) coded using the MHC format (graph 610) and the BCD format (graph 620). In the most common segment of probability distribution, the MHC format provides about 64% reduction in an average number of bit changes per a data word. In the graphs 610 and 620, depicted data points are obtained using the results of computer analysis performed on one billion of random 32-bit BCD data words 201 and one billion of the corresponding MHC data words 203.

Figure 7:
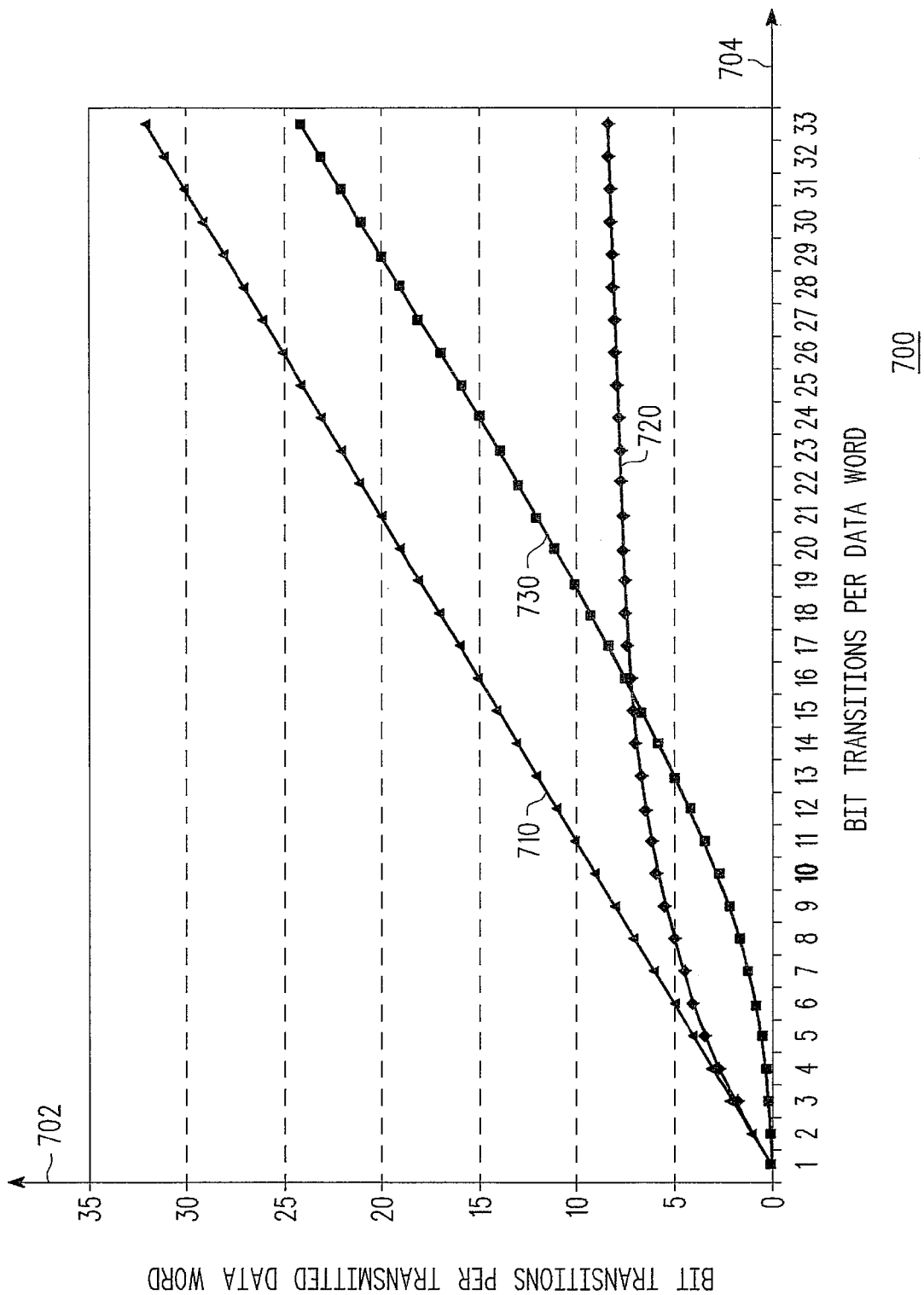
FIG. 7 depicts a series of exemplary graphs illustrating a reduction in bit transitions during transmission of random data using the method of FIG. 1.

FIG. 7 depicts a series 700 of exemplary graphs illustrating a reduction in bit transitions on bit lanes of a respective bus (e.g., data bus 502 in FIG. 5) during transmission of data using the method 100 of FIG. 1. More specifically, graphs 710 and 720 show an average number of bit transitions in a transmitted random 32-bit data word (y-axis 702) as a function of a number of bit transitions (x-axis 704) when the data word is coded using the BCD format (graph 710) and the MHC format (graph 720). A graph 730 illustrates a numerical value of a reduction in an average number of bit transitions during transmission of random 32-bit data words 203 versus the corresponding BCD data words 201. Similar to information shown in FIG. 6, this data is also obtained using the results of computer analysis performed on one billion of random 32-bit data words.

While the invention has been particularly shown and described with reference to preferred embodiments, it will be understood by those skilled in the art that various changes in form and detail may be made without departing from the spirit and scope of the invention. Any variations, modifications, additions, and improvements to the embodiments described are possible and may fall within the cope of the invention as detailed within the following claims.

What is claimed is:

1. A method for transmitting binary-coded data, comprising:
   (a) partitioning each binary-coded data word in a plurality of data nibbles, each data nibble having a pre-determined number of consecutive bits of the binary-coded data word;
   (b) coding each data nibble using a coding format transforming a data nibble in a data segment having a plurality of bit groups, wherein:
      a number of bits in each bit group is equal to the pre-determined number; and
      a change in a digital state at a bit position in a more significant bit group is maintained at that bit position in less significant bit groups of the data segment;
   (c) transmitting data segments in phases, each phase including one bit group from each data segment.

2. The method of claim 1 wherein the step (a) further comprises:
   setting the pre-determined number to 4.

3. The method of claim 1 wherein the step (b) further comprises:
   transmitting a digital state at a bit position in the bit group in a form of a transition between digital states.

4. The method of claim 1 wherein the step (c) further comprises:
   synchronizing transmission of at least a portion of the phases with the same edge of a clock signal.

5. The method of claim 1 wherein the step (c) further comprises:
   transmitting bit groups including bits of same significance using pre-assigned bit lanes of a transmission bus.

6. The method of claim 1 further comprising:
   (d) assembling, at a destination terminal, received bit groups in received data segments;

(e) re-formatting the received data segments in received data nibbles; and
(f) assembling the binary-coded data word from the received data nibbles.

7. The method of claim 6 wherein the step (d) further comprises:
assembling the received data segments using one received bit group in each of the phases.

8. The method of claim 6 wherein the step (e) further comprises:
selectively converting each data segment in a data nibble of the binary-coded data word.

9. The method of claim 1 wherein the binary-coded data is coded using a binary-coded decimal (BCD) format, a binary-coded hexadecimal (BCH) format, or a binary-coded octal (BCO) format.

10. The method of claim 1 wherein the binary-coded data is information, an address of the information, a command, or a combination thereof.

11. A device, comprising:
(a) coding data in binary-coded data words using at least one digital data format;
(b) at a transmitting terminal:
    (b1) partitioning each binary-coded data word in a plurality of data nibbles, each data nibble having a pre-determined number of consecutive bits of the binary-coded data word;
    (b2) coding each data nibble using a modified 1-bit hot coding format transforming a data nibble in a data segment having a plurality of bit groups, wherein:
        a number of bits in each bit group is equal to the pre-determined number; and
        a change in a digital state at a bit position in a more significant bit group is maintained at that bit position in less significant bit groups of the data segment; and
    (b3) transmitting data segments in phases, each phase including one bit group from each data segment; and
(c) at a receiving terminal:
    (c1) assembling received bit groups in received data segments;
    (c2) re-formatting the received data segments in received data nibbles; and
    (c3) assembling the binary-coded data word from the received data nibbles.

12. The method of claim 11 wherein the step (b2) further comprises:
transmitting a digital state at a bit position in the bit group in a form of a transition between digital states.

13. The method of claim 11 wherein the step (b3) further comprises:
synchronizing transmission of at least a portion of the phases with the same edge of a clock signal.

14. The method of claim 11 wherein the step (b3) further comprises:
transmitting bit groups including bits of same significance using pre-assigned bit lanes of a transmission bus.

15. The method of claim 11 wherein the step (c1) further comprises:
assembling the received data segments using one received bit group in each of the phases.

16. A computer readable medium storing program code that, when executed by a data processor, facilitates execution of the method of claim 11.

17. A system for transmitting binary-coded data, comprising:
a transmitting terminal; and
a receiving terminal coupled to the transmitting terminal using a system interface including at least one of a data bus, an address bus, a command bus, or a combination thereof, wherein each of said terminals includes at least one unit, including:
(a) a TX state machine adapted for processing an outgoing data stream and:
    (a1) partitioning each binary-coded data word in a plurality of data nibbles, each data nibble having a pre-determined number of consecutive bits of the binary-coded data word;
    (a2) coding each data nibble using a modified 1-bit hot coding format transforming a data nibble in a data segment having a plurality of bit groups, wherein:
        a number of bits in each bit group is equal to the pre-determined number; and
        a change in a digital state at a bit position in a more significant bit group is maintained at that bit position in less significant bit groups of the data segment; and
    (a3) transmitting data segments in phases, each phase including one bit group from each data segment;
(b) a RX state machine adapted to process an incoming data stream and:
    (b1) assembling received bit groups in received data segments;
    (b2) re-formatting the received data segments in received data nibbles; and
    (b3) assembling the binary-coded data word from the received data nibbles; and
(c) means providing selective connectivity between the TX and RX state machines and the interface.

18. The system of claim 17, wherein the at least one unit further comprises:
a bus control state machine administering the RX and TX state machines.

19. The system of claim 17 wherein at least one unit further comprises:
means allowing to bypass the TX and RX state machines during transmission or receipt of the binary-coded data.

20. The system of claim 17, wherein, during the step (a2), the TX state machine is further adapted for transmitting a digital state at a bit position in the bit group in a form of a transition between digital states.

21. The system of claim 17, wherein, during the step (a3), the TX state machine is further adapted for synchronizing transmission of at least a portion of the phases with the same edge of a clock signal.

22. The system of claim 17, wherein, during the step (a3), the TX state machine is further adapted for transmitting bit groups including bits of same significance using pre-assigned bit lanes of a transmission bus.

23. The system of claim 17, wherein the binary-coded data is coded using a binary-coded decimal (BCD) format, a binary-coded hexadecimal (BCH) format, or a binary-coded octal (BCO) format.

24. The system of claim 17, wherein said system is a portion of a system-on-chip (SoC) device.

* * * * *

UNITED STATES PATENT AND TRADEMARK OFFICE
CERTIFICATE OF CORRECTION

PATENT NO. : 7,378,993 B2 Page 1 of 1
APPLICATION NO. : 11/619932
DATED : May 27, 2008
INVENTOR(S) : Colin MacDonald It is certified that error appears in the above-identified patent and that said Letters Patent is hereby corrected as shown below:

In Column 7, Line 20, Claim No. 11:
 Change "A device, comprising:" to --A method, comprising:--

Signed and Sealed this

Twenty-third Day of September, 2008

JON W. DUDAS
*Director of the United States Patent and Trademark Office*